United States Patent [19]

Lee

[11] Patent Number: 5,350,490
[45] Date of Patent: Sep. 27, 1994

[54] FORMING A COLOR FILTER ON A SEMICONDUCTOR SUBSTRATE

[75] Inventor: Hyung S. Lee, Seoul, Rep. of Korea

[73] Assignee: Samsung Electronics Ltd., Kyunggi-do

[21] Appl. No.: 24,205

[22] Filed: Feb. 22, 1993

[30] Foreign Application Priority Data

Feb. 21, 1992 [KR] Rep. of Korea .............. 92-2667

[51] Int. Cl.$^5$ ..................... B44C 1/22; B29C 37/00
[52] U.S. Cl. ..................... 156/655; 156/668; 437/53; 437/228
[58] Field of Search ............ 156/630, 633, 652, 655, 156/668; 437/53, 228

[56] References Cited

U.S. PATENT DOCUMENTS 5,185,059 2/1993 Nishida et al. .............. 156/659.1

Primary Examiner—William Powell
Attorney, Agent, or Firm—Cushman, Darby & Cushman

[57] ABSTRACT

A manufacturing method for color filter comprises steps of forming a flat layer for smoothing over an image sensor having charge coupled devices or bucket brigade device, forming a first color filter layer and a first inter-layer of dye-proof layer on said flat layer, alternately forming color filter layers and inter-layers in the same manner as above describe steps in order to form a second color filter layer, a second inter-layer, a third color filter layer and a third inter-layer, wherein the first or the third inter-layer is formed of a negative polyimide having a relatively lower thermal shrinkage. In this method, the material for forming the inter-layer which has been the problem in thermal hardening due to the relatively higher thermal shrinkage is substituted with the negative polyimide having a relatively lower thermal shrinkage, so that the stress acted on the interface between the color filter layer and the inter-layer can be minimized, so that image sensor having a superior spectrum characteristic and sensitivity can be obtained.

7 Claims, 2 Drawing Sheets

FORMING A COLOR FILTER ON A SEMICONDUCTOR SUBSTRATE

BACKGROUND OF THE INVENTION

The present invention relates to a method of manufacturing a color filter for use in a solid-state image sensor or a contact type image sensor such as charge coupled device(CCD) or bucket brigade device(BBD).

For a solid-state image sensor, a particular wave of light to be incident on a surface of the image sensor like CCD or BBD is selectively radiated in order to obtain a color, for which there has been made a color filter for color separation divided by red, green, blue or yellow, cyan, magenta. In this case, for a display device such as liquid crystal display(LCD), the receiving of light is just changed.

Currently, as a color filter, there is being widely adapted an organic dye type(or on-chip type) which obtains a desired spectrum characteristic in a manner that an easily dyed photosensitive resin is patternized by a photo-etching technique and the resultant pattern is dyed by a dyeing material.

The method of manufacturing such a conventional color filter which is formed on the charge coupled devices is now explained.

By way of an example therefor, it is preferably taken cross-sectional view of the image sensor of which the color filter is formed on an interline transfer charge coupled device(referred to as IT-CCD hereinbelow), as shown in FIG. 1. The conventional technique of FIG. 1 is described in Matsushidat technique report(90.6 vol.36. No. 3) and Nichei Micro Device(1989 December version).

Referring to FIG. 1, IT-CCD comprises photodiodes 32, 33, 34, 35, 36, 37 and 38 for optical-to-electrical converting the light to be incident on the surface of p-type semiconductor substrate, an active area having a charge-transfer part repeatedly arranged for transferring charges, the active area being adjacent to the photodiodes 32, 33, 34, 35, 36, 37 and 38, and a pad area having pad part 52 for externally transferring a signal, the pad area being adjacent to the active area.

The photodiodes 32-38 may have PNP structure by being formed on p-type semiconductor substrate 30 or PNPN structure in order to remove dark current.

The charge transfer part 50 comprises an insulating layer 44 of $SiO_2$ for insulating a first conductive layer 42 of polycrystal silicon transferring charges, a second conductive layer 46 of polycrystal silicon formed on the insulating layer 44 and a light blocking layer 48 of dual layer of metal aluminium Al and $SiW_x$ formed on the second conductive layer 46.

On the IT-CCD, color filter is formed. First, on the entire surface of IT-CCD, a flat layer 40 is formed in order to form a uniformed color filter layer and to prevent the light blocking layer 48 and the metal pad part 52 as metal layers from being corroded due to the acid radical of a photosensitive material when a color pattern array(referred to as a color filter layer hereinafter) is dyed over the entire surface of IT-CCD. The flat layer 40 is formed of a positive polyimide having an excellent light transmissivity and a photo-sensitivity at a hardening temperature.

Thereafter, according to the conventional method for manufacturing color filter layer, a photo-sensitive layer having photo-sensitivity by using ammonium dichromate on hydrophile macromolecule material such as polyvinyl alcohol, casein or gelatine is evenly deposited. Then, after drying it, only the first color pattern portion is exposed and developed by mask exposing method, thereby forming a desired pattern.

By dyeing the pattern with a dyeing material having a predetermined spectrum characteristic, magenta layer of the first color filter layer 54 is formed at the position corresponding to the first photodiode 32.

Then, the second and the third color filter layers are formed in the same manner. A first inter-layer 56 is formed as a dye-proof layer for protecting the first color filter 54 from being dyed by yellow dyeing material on the entire surface of the flat layer 40 and the first color filter layer 54. The first inter-layer 56 is formed of a positive polyimide.

After forming the first inter-layer 56, the second filter layer 58 of yellow layer is formed on the first inter-layer 56 corresponding to the second and the third photodiodes 34 and 36.

In order to prevent the second color filter layer 58 from being dyed by cyan material, a second inter-layer 60 of positive polyimide is formed on the entire surface of the first inter-layer 56 and the second color filter layer 58. A third color filter layer 62 of cyan layer is formed at the position corresponding to the third photodiode 36 disposed on the second inter-layer 60. The overlapped portion 66 of the second color filter layer 58 and the third color filter layer 62 has green color.

In order to protect the third color filter 62 from an external impact, a third inter-layer 64 of positive polyimide is formed on the entire surface of the second inter-layer 60 and the third color filter layer 62. Thereafter, for the purpose of wire bonding, the flat layer, the first, the second and the third inter-layer 56, 60 and 64 formed as above-described are removed at a time by photo-etching process so as for the pad area 52 to be exposed.

In the manufacturing method color filter on the IT-CCD as described above, as for the complementary color type with an improved color sensitivity, it is noted that cyan layer and yellow layer are mutually overlapped in order to form green layer. That is, the first, the second and the third color filter layers 54, 58 and 62 are formed on the IT-CCD, and inter-layer 56, 60 and 64 are formed as a transparent dye-proof layer for prevent the colors from mixing in the color filter layer.

Recently, as the light receiving part is being decreased in accordance with the high-efficiency of the IT-CCD, the area per unit pixel is in a tendency toward reduction. Accordingly, the allowance margin against a defect in the inter-layer and the align accuracy for the color filter layer is also reduced.

Such a need causes defects for the inter-layer in thermal hardening process. That is, in the thermal hardening process carried out each time after forming each color filter layer, the inter-layer is deformed due to a thermal shrinkage, resulting in a possibility that the color filter layer would be moved or the inter-layer would be cracked.

For the purpose of avoiding it, there has been used a process in which inter-layer is made by stacking different material each other, nevertheless, a problem still remains as far as concerned the thermal shrinkage according to the hardening process for the color filter layer. In particular, the inter-layer is formed of a positive polyimide which is widely used because of its excellent light transmissivity. However, even the material has severe thermal shrinkage in its characteristic, so that a stress is acted on the interface between the color filter layer and the inter-layer, causing the movement of the color filter layer and even the image defect such as a wave trace or white blot due to a crack of the inter-layer, resulting in degrading the characteristic of the image sensor.

SUMMARY OF THE INVENTION

It is an object of the present invention to provide a manufacturing method of a color filter having a superior spectrum characteristic and high sensitivity in which inter-layer is formed of a transparent resin having a lower thermal shrinkage and hardly dyed with a dyeing material.

According to the present invention, there is provided a manufacturing method for color filter including the steps of forming a flat layer for smoothing over an image sensor having charge coupled devices and bucket brigade device; forming a first color filter layer and a first inter-layer of dye-proof layer on said flat layer; alternately forming color filter layers and inter-layers in the same manner as above described step to form a second color filter layer, a second inter-layer, a third color filter layer and a third inter-layer: wherein the first or the third inter-layer is formed of a negative polyimide having a relatively lower thermal shrinkage.

BRIEF DESCRIPTION OF THE DRAWINGS

These and other objects, features, and advantages of the present invention will become more apparent from the following description of the preferred embodiment taken in conjunction with the accompanying drawings, in which.

DETAILED DESCRIPTION OF THE PREFERRED EMBODIMENT

Now, the preferred embodiment according to the present invention will be explained in detail with the accompanying drawings.

Figure 1:
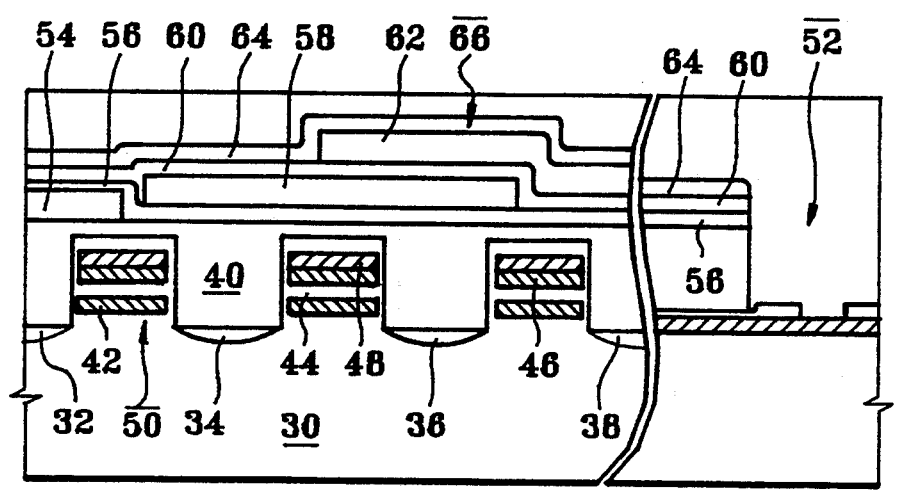
FIG. 1 is a vertical cross-sectional view of an image sensor of CCDs type for explaining a conventional color filter manufacturing method.

A color filter is generally formed in a shape of stripes or mosaic on an image sensor including CCDs or BBD. In this embodiment, it is described a color filter formed on the IT-CCD image sensor having the same structure as the conventional image sensor including photodiodes and light blocking layer of FIG. 1.

Figure 2A:
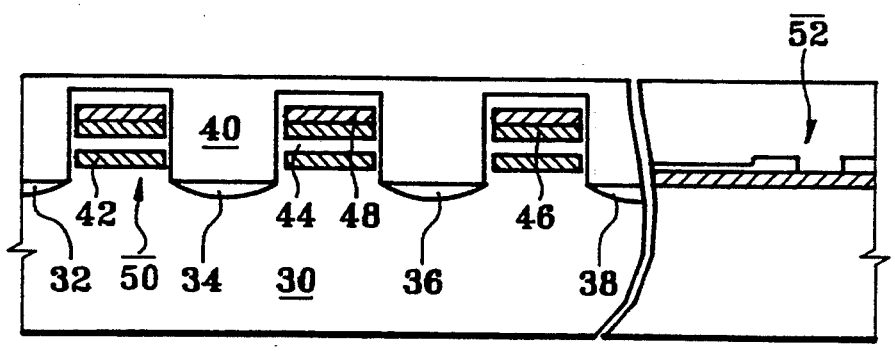
FIGS. 2A-2D are manufacturing processing figures of the color filter according to the preferred embodiments of the present invention.

First, as shown in FIG. 2A, polyimide having an excellent light transmissivity and an unchanged photo-sensitivity at a hardening temperature on the IT-CCD is deposited with thickness of 3.5 $\mu$m, which is then heated for 5 minutes at 170° C. in a hot plate to form a flat layer 40. As a preferable positive polyimide, a CFGR-2010(Tokyo Ohka Kogyo Co. LTD) may be used, and as a developing liquid and a rinse, CRFT-Developer, Rinse(Tokyo Ohka Kogyo Co., LTD) may be used.

Figure 2B:
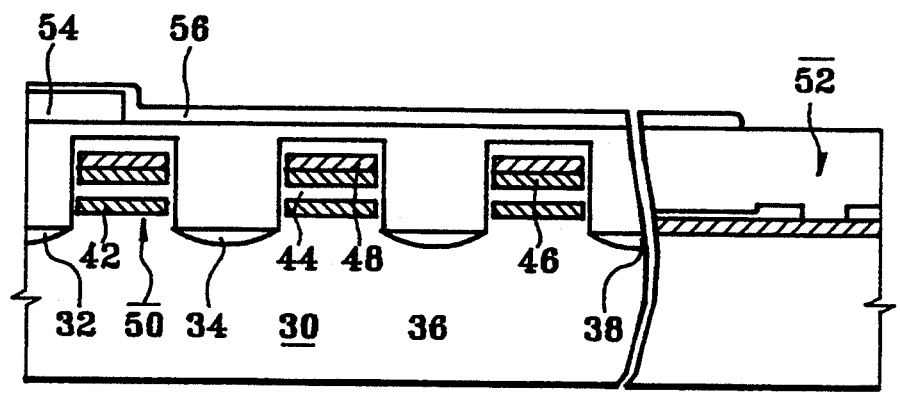

Referring to FIG. 2B, magenta layer of a first color filter layer 54 is formed at the position corresponding to a first photodiode 32 disposed on the flat layer 40 in accordance with the manufacturing method of the conventional color filter layer. Thereafter, a negative polyimide having a lower thermal shrinkage expansion ratio, even though its photo-sensitivity is changed at a hardening temperature, is formed with thickness of 0.8 $\mu$m, and is softly baked in the hot plate for 70 seconds at 90° C. Then, after the polyimide is exposed and developed at deep UV(240~270 nm), it is again heated in the hot plate at 105° C. for 5 minutes, thereby forming a first inter-layer 56 with only the pad area 52 exposed.

As a preferable polyimide, there are FVR-7, FVR-10(Fuji Chemical Co., LTD), while as a preferable developing liquid and rinse liquid, there are FVR-Developer and Rinse(Fuji Chemical Co., LTD).

Figure 2C:
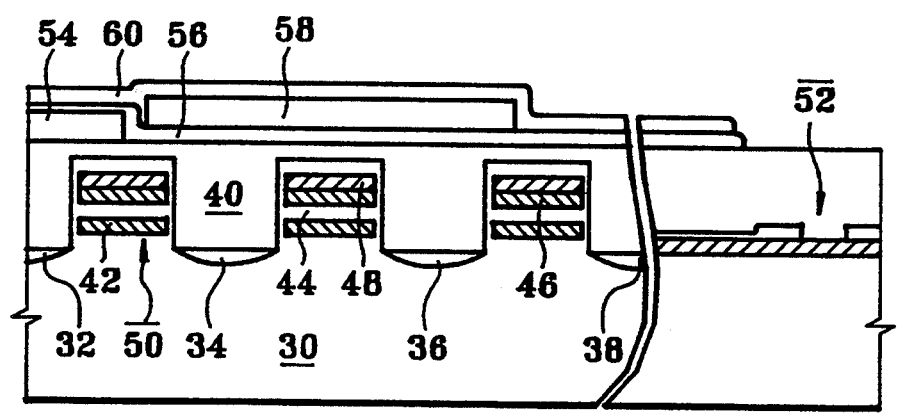

After forming the first inter-layer 56, as shown in FIG. 2C, yellow layer of the second color filter layer 58 is formed at the position corresponding to the second and the third photodiodes 34 and 36 disposed on the first inter-layer 56. Thereafter, on the final structure, a negative polyimide is deposited for a second color filter layer 58 not to be dyed by cyan dyeing material, and the second inter-layer 60 of dye-proof layer is formed in the same manner as previously described.

Figure 2D:
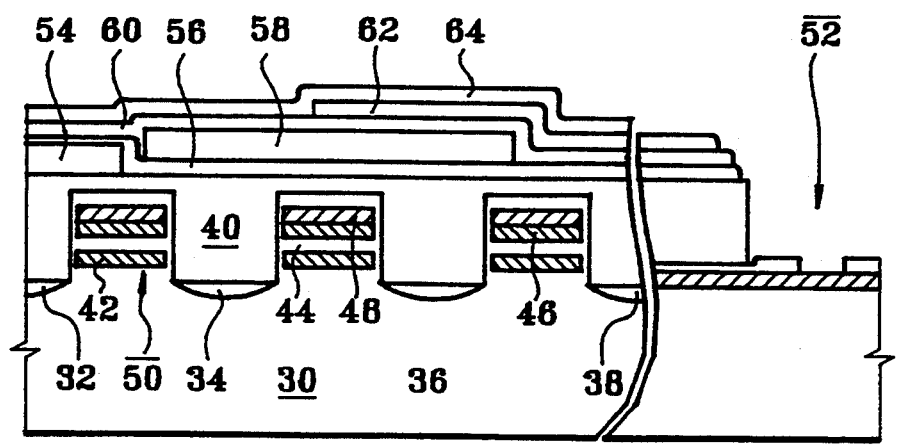

Subsequently, as shown in FIG. 2D, cyan layer of a third color filter layer 62 is formed at the position corresponding to the fourth photodiode 38. The cyan layer is overlapped with the second color filter layer 58 formed on the upper part of the third photodiode 36 disposed on the second inter-layer 60. Then, a third inter-layer 64 is formed on the surface of the third color filter layer 62 in order to protect the third color filter layer 62 from an external impact. At this time, the third inter-layer 64 is formed with only the pad area 52 exposed.

After that, the first, the second and the third inter-layer are formed on the pad area 52. These inter-layer may be formed by a negative polyimide with thickness of 4.1 $\mu$m, or by a successive mixture of negative polyimide with thickness of 0.6~1.0 $\mu$m and positive polyimide with thickness of 2.0~4.0 $\mu$m. Preferably, in the thickness of the mixture, the negative polyimide is 0.8 $\mu$m and the positive polyimide is 3.3 $\mu$m.

Furthermore, for the first, the second and the third inter-layer 36, 60 and 64, a positive polyimide having a lower thermal shrinkage expansion ratio and maintaining the photo-sensitivity at the hardening temperature.

As mentioned up to now, in the present invention, the material for forming the inter-layer which has been the problem in thermal hardening due to the relatively higher thermal shrinkage is substituted with the negative polyimide having a relatively lower thermal shrinkage, so that the stress acted on the interface between the color filter layer and the inter-layer can be minimized, thereby preventing the movement of the color filter layer and the crack of the inter-layer, resulting in that image sensor having a superior spectrum characteristic and sensitivity.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A method for manufacturing a color filter comprising the steps of:

forming a flat layer for smoothing over an image sensor having charge coupled devices or bucket brigade device, forming a first color filter layer and a first inter-layer of dye-proof layer on said flat layer, alternately forming color filter layers and inter-layers in order to form a second color filter layer, a second inter-layer, a third color filter layer and a third inter-layer, wherein each of said first, second and third inter-layer is formed of a negative photo-sensitivity resin having a relatively low thermal shrinkage.

2. The method according to claim 1, wherein each of said first, second and third inter-layer is formed of a positive photo-sensitivity resin having a relatively low thermal shrinkage.

3. The method according to claim 2, wherein said positive photo-sensitivity resin forming the first, the second and thrid inter-layer has a thickness of 0.6~1.0 μm.

4. The method according to claim 1, wherein the third inter-layer is formed by mixed layers of negative photo-sensitivity resin and positive photo-sensitivity resin having a relatively low thermal shrinkage.

5. The method according to claim 3, wherein said negative photo-sensitivity resin has a thickness of 0.6~1.0 μm, and the flat layer has a thickness of 2.0~4.0 μm.

6. The method according to claim 1, wherein said flat layer is formed of a negative photo-sensitivity resin having an unchanged photo-sensitivity at hardening temperature.

7. The method according to claim 1, wherein the method further includes a step for etching an inter-layer of a pad area each time after forming the first, the second and third inter-layers, respectively.

* * * * *